(12) United States Patent
Kang et al.

(10) Patent No.: US 8,721,117 B2
(45) Date of Patent: May 13, 2014

(54) LIGHTING DEVICE

(75) Inventors: Seok Hoon Kang, Gwangju (KR); Jun Seok Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 203 days.

(21) Appl. No.: 12/675,589

(22) PCT Filed: Aug. 20, 2008

(86) PCT No.: PCT/KR2008/004855
§ 371 (c)(1),
(2), (4) Date: Feb. 26, 2010

(87) PCT Pub. No.: WO2009/028829
PCT Pub. Date: Mar. 5, 2009

(65) Prior Publication Data
US 2010/0238674 A1    Sep. 23, 2010

(30) Foreign Application Priority Data
Aug. 31, 2007   (KR) .................. 10-2007-0088342

(51) Int. Cl.
*F21S 4/00* (2006.01)
*H01R 12/00* (2006.01)
*H05K 1/00* (2006.01)

(52) U.S. Cl.
USPC . 362/249.02; 362/219; 362/221; 362/217.17; 362/640; 362/646; 439/65; 439/79

(58) Field of Classification Search
USPC .................. 362/219, 221, 217.17, 640, 646, 362/249.02; 439/65, 79
See application file for complete search history.

(56) References Cited

U.S. PATENT DOCUMENTS

| | | | | |
|---|---|---|---|---|
| 3,706,954 A | * | 12/1972 | Krafthefer | ...................... 439/65 |
| 5,349,508 A | * | 9/1994 | Karbaf | .......................... 362/221 |
| 6,764,196 B2 | * | 7/2004 | Bailey | .......................... 362/147 |
| 6,799,995 B2 | | 10/2004 | Hsu et al. | |
| 6,805,560 B1 | * | 10/2004 | Budny et al. | ..................... 439/65 |
| 7,064,674 B2 | * | 6/2006 | Pederson | ................. 340/815.45 |
| 7,284,874 B2 | | 10/2007 | Jeong et al. | |
| 7,322,718 B2 | | 1/2008 | Setomoto et al. | |
| 7,830,356 B2 | | 11/2010 | Lee et al. | |
| 2002/0032813 A1 | | 3/2002 | Hosaka et al. | |
| 2004/0184263 A1 | * | 9/2004 | Patti | .............................. 362/145 |
| 2005/0207165 A1 | | 9/2005 | Shimizu et al. | |
| 2005/0265051 A1 | | 12/2005 | Yamamoto et al. | |
| 2006/0002142 A1 | | 1/2006 | Jeong et al. | |
| 2006/0087843 A1 | * | 4/2006 | Setomoto et al. | ............. 362/249 |
| 2006/0092346 A1 | | 5/2006 | Moon et al. | |

(Continued)

FOREIGN PATENT DOCUMENTS

CN    1702521 A    11/2005
CN    1896586 A     1/2007

(Continued)

*Primary Examiner* — Jong-Suk (James) Lee
*Assistant Examiner* — Tsion Tumebo
(74) *Attorney, Agent, or Firm* — Birch, Stewart, Kolasch & Birch, LLP

(57) ABSTRACT

A lighting device comprises: a first substrate comprising a first connector and a first connection terminal, the first connector being connected to an external power supply or driving device, the first connection terminal being electrically connected to the first connector; and a second substrate connected electrically to the first connection terminal and comprising a light emitting device.

20 Claims, 2 Drawing Sheets

(56) References Cited

U.S. PATENT DOCUMENTS

| | | |
|---|---|---|
| 2007/0013647 A1 | 1/2007 | Lee et al. |
| 2007/0242477 A1 | 10/2007 | Yoo et al. |
| 2008/0079137 A1 | 4/2008 | Lee |
| 2008/0266842 A1 * | 10/2008 | Skidmore et al. ............. 362/147 |

FOREIGN PATENT DOCUMENTS

| | | |
|---|---|---|
| JP | 6-314071 A | 11/1994 |
| JP | 2000-214970 A | 8/2000 |
| JP | 2004-253364 A | 9/2004 |
| KR | 10-2006-0000236 A | 1/2006 |
| KR | 10-2006-0046148 A | 5/2006 |
| KR | 10-2006-0135203 A | 12/2006 |
| KR | 10-2007-0009149 A | 1/2007 |
| KR | 10-0755615 B1 | 9/2007 |
| TW | 320815 | 11/1997 |
| TW | 559391 | 10/2003 |
| TW | 566703 | 12/2003 |
| TW | 567619 | 12/2003 |
| TW | 200537051 | 11/2005 |
| TW | 312771 | 5/2007 |
| TW | 200731582 | 8/2007 |

* cited by examiner

LIGHTING DEVICE

TECHNICAL FIELD

The present disclosure relates to a lighting device.

BACKGROUND ART

A liquid crystal display (LCD) is used in various electric devices such as a computer monitor, a television, a mobile communication terminal, a navigation, etc.

Because the LCD does not emit light by itself, a backlight unit for providing light to the LCD is used at the rear of the LCD.

Although a cold cathode fluorescent lamp (CCFL) as a backlight unit has been used as a light source until now, a light emitting diode (LED) becomes widely used recently.

The LED is used as a backlight unit of the LCD and also as light source units of various electron devices requiring light and lightening devices.

DISCLOSURE OF INVENTION

Technical Problem

Embodiments provide a lighting device.

Embodiments also provide a lighting device for driving each substrate with a light emitting device.

Embodiments also provide a lighting device that is fabricated without difficulties and easily repairable when defects occur.

Technical Solution

In an embodiment, a lighting device comprises: a first substrate comprising a first connector and a first connection terminal, the first connector being connected to an external power supply or driving device, the first connection terminal being electrically connected to the first connector; and a second substrate connected electrically to the first connection terminal and comprising a light emitting device.

In an embodiment, a lighting device comprises: a first substrate comprising a first connector and a plurality of first connection terminals, the first connector being connected to an external power supply or driving device, the first connection terminals being electrically connected to the first connector; and a plurality of second substrates connected electrically to the first connection terminals and comprising a light emitting device.

The details of one or more embodiments are set forth in the accompanying drawings and the description below. Other features will be apparent from the description and drawings and from the claims.

Advantageous Effects

Embodiments provide a lighting device.

Embodiments also provide a lighting device for driving each substrate with a light emitting device.

Embodiments also provide a lighting device that is fabricated without difficulties and easily repairable when defects occur.

MODE FOR THE INVENTION

Hereinafter, a lighting device will be described in more detail with reference to the accompanying drawings.

Figure 1:
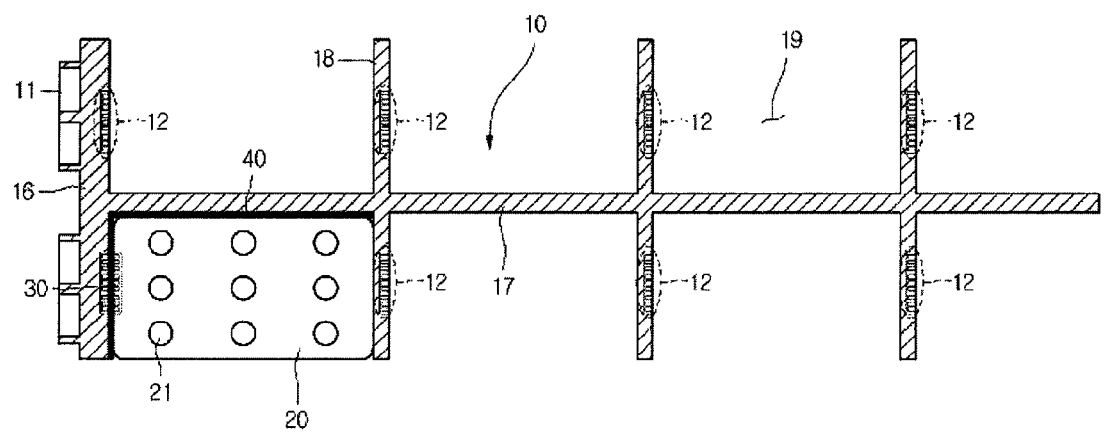
FIG. 1 is a front view of a lighting device according to an embodiment.
Figure 2:
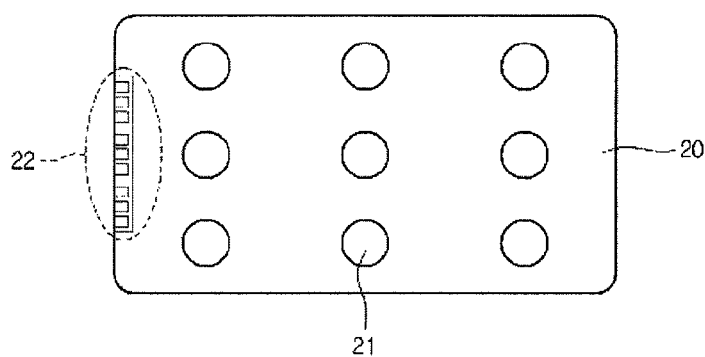
FIG. 2 is a view of a second substrate in a lighting device according to an embodiment.

FIG. 1 is a front view of a lighting device according to an embodiment. FIG. 2 is a view of a second substrate in a lighting device according to an embodiment.

Referring to FIGS. 1 and 2, the lighting device includes a first substrate 10 and a second substrate 20 installed to the first substrate 10.

The first substrate 10 includes a first connector unit 16 with a first connector 11, an extension unit 17 extending from the first connector unit 16 in a first direction, and a connection unit 18 extending from the extension unit 17 in a second direction perpendicular to the first direction.

A plurality of first connectors 11 and first connection terminals 12 are formed at the first connector unit 16, and the first connection terminals 12 are formed at each connection unit 18. Moreover, a wiring (not shown) is formed in order to electrically connect the first connector 11 of the first connector unit 16 with the first connection terminal 12.

A plurality of the first connection terminals 12 is disposed at the connection unit 18.

The first connector 11 is connected to an external power supply or driving device and the first connection terminal 12 is electrically connected to an external power supply or driving device through the first connector 11.

The extension unit 17 and the connection unit 18 form a second substrate mounting portion 19, which is a space where the second substrate 20 can be mounted.

As illustrated in FIG. 1, there are eight second substrate mounting portions 19. The two second substrate mounting portions 19 adjacent to the first connector unit 16 are formed by a space surrounded by the first connector unit 16, the extension unit 17, and the connection unit 18.

The second substrates 20 may be attached to the first substrate 10. Although one second substrate 20 is attached to the first substrate 10 as illustrated in FIG. 1, the eight second substrates 20 can be attached to the first substrate 10.

A second connection terminal 22 and a light emitting device 21 are formed at the second substrate 20 in order to electrically connect the light emitting device 21 with the first substrate 10. Of course, the light emitting device 21 and the second connection terminal 22 are electrically connected to each other in series or parallel through a wiring (not shown) included in the second substrate 20.

The light emitting device 21 may be installed in plurality. In FIG. 2, the nine light emitting devices 21 are installed on the second substrate 20.

A light emitting diode emitting a white light may be used in the light emitting device 21, and other light emitting diodes emitting red, green, and blue lights may be combined and used in the light emitting device 21.

The second substrate 20 is electrically connected to the first connector 11 through the first connection terminal 12 built in the first substrate 10.

Each first connection terminals 12 in the first substrate 10 may be connected to the first connector 11. That is, the same drive signal or different signals may be applied to the first connection terminals 12 through the first connector 11.

Accordingly, the light emitting devices 21 installed on the second substrate 20 may be separately controllable through the first connector 11 in the first substrate 10.

For example, if it is assumed that the luminance of light emitted from any one of the second substrates 20 is represented with a value of 100, the luminance of light emitted from another second substrate 20 may be adjusted to a value of 90.

Additionally, the luminance of light emitted from another second substrate 20 may be adjusted to a value of 50.

Therefore, according to the purpose of the lighting device, an entire or partial luminance of the lighting device can be appropriately controllable.

On the other hand, the first substrate 10 and the second substrate 20 may be more firmly coupled through a mounting member 40. The mounting member 40 may be adhesives or adhesive tapes and also other devices for mounting.

According to the lighting device, because the second substrates 20 with a light emitting device 21 is installed to the first substrate 10, only the defective second substrate 20 can be replaced if there are defects in the light emitting device 21 or the second substrate 20. Therefore, the lighting device is easily reparable without difficulties.

Moreover, the lighting device according to an embodiment can control the light emitting devices 21 by one second substrate 20, and also can separately control the light emitting devices 21 included in one second substrate 20 based on a circuit design.

Furthermore, the first substrate 10 and the second substrate 20 do not overlap in a vertical direction. That is, the first substrate 10 and the second substrate 20 are disposed on the same horizontal plane. Therefore, heat dissipation characteristic becomes very excellent.

Figure 3:
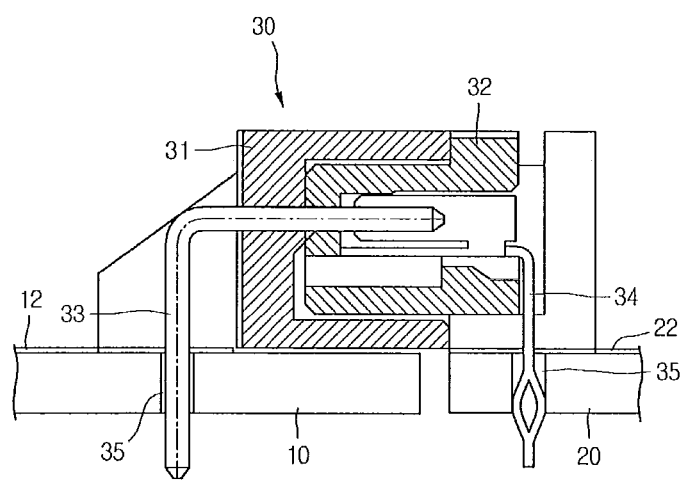
FIG. 3 is a view illustrating a second connector in a lighting device according to an embodiment.

On the other hand, the first substrate 10 may be electrically connected to the second substrate 20 through a second connector 30 of FIG. 3. Moreover, the first substrate 10 and the second substrate 20 may be more firmly coupled through the second connector 30. The second connector 30 will be described in more detail with reference to FIG. 3.

FIG. 3 is a view illustrating a second connector for electrically connecting a first substrate with a second substrate in a lighting device according to an embodiment.

The second connector 30 includes a first body 31 and a second body 32. One of the first and second bodies 31 and 32 is designed to be inserted into the other one for coupling.

For example, as illustrated in FIG. 3, the second body 32 is partially inserted into the first body 31 for coupling.

A first pin 33 that is electrically connected to the first connection terminal 12 of the first substrate 10 is formed in the first body 31, and a second pin 34 that is electrically connected to the second connection terminal 22 of the second substrate 20 is formed in the second body 32.

The first and second pins 33 and 34 are electrically connected to each other as the first and second bodies 31 and 32 are coupled.

A solder 35 may be filled in a via hole of the first substrate 10 in order to obtain more firm electrical and physical connection between the first pin 33 and the first substrate 10 and the first connection terminal 12.

Likewise, a solder 35 may be filled in a via hole of the second substrate 20 in order to obtain more firm electrical and physical coupling between the second pin 34, the second substrate 20, and the second connection terminal 22.

Because the first and second pins 33 and 34 respectively penetrate the first and second substrates 10 and 20, the first and second bodies 31 and 32 can be more firmly installed to and electrically connected to the first and second substrates 10 and 20.

The lighting device according to an embodiment includes the first substrate 10 and the plurality of second substrates 20 mounted on the first substrate 10.

When there is a defective light emitting device 21 in one second substrate 20, the lighting device removes only one second substrate with the defective light emitting device 21 and replaces it with another second substrate 20. Thus, its repairing process is accomplished without difficulties and costs and time for repairing can be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

A lighting device according to an embodiment can be used in various electron devices and lightening devices.

The invention claimed is:

1. A lighting device comprising:
a first substrate; and
a plurality of second substrates electrically connected to the first substrate and comprising a light emitting device, wherein the first substrate comprises:
a connector unit comprising:
a plurality of first connection terminals;
a plurality of first connectors, the first connectors electrically connecting the first connection terminals to an external power supply or driving device, wherein the first connectors and the first connection terminals are disposed on opposite side surfaces of the connector unit,
an extension unit extending from the connector unit; and
a plurality of connection units extending in opposite directions from both sides of the extension unit;
a plurality of second connectors, each second connector electrically connecting each connection unit of the first substrate with a second substrate,
wherein each of the plurality of connection units comprises one of the first connection terminals disposed on at least a portion of each respective connection unit, and
wherein at least two of the connector unit, the extension unit and the respective connection units are formed of the same material in an integral unit.

2. The lighting device of claim 1, wherein the second substrates are disposed on both sides of the extension unit.

3. The lighting device of claim 1, wherein the second substrates are disposed on both sides of each of the connection units.

4. The lighting device of claim 1, wherein the first and second substrates are coupled by a mounting member.

5. The lighting device of claim 4, wherein the mounting member comprises adhesives or adhesive tapes.

6. The lighting device of claim 1, wherein top surfaces of the first and second substrates are disposed in a same horizontal plane, and
wherein side surfaces of the first and second substrates face each other.

7. The lighting device of claim 1, wherein each of the second substrates is electrically connected to one of the plurality of connection units.

8. The lighting device of claim 1, wherein each of the first connectors is electrically connected to at least one of the first connection terminals by using a wire.

9. The lighting device of claim 8, wherein the second substrates are separately controlled by different signals through each of the first connectors.

10. The lighting device of claim 1, wherein the second connectors each comprises:
a first pin connected electrically to the first connection terminal of the first substrate;
a first body supporting the first pin and coupled to the first substrate;
a second pin connected electrically to the second substrate;
a second body supporting the second pin and coupled to the second substrate;
a first via hole in the first substrate; and
a solder filled in the first via hole to couple the first substrate and the first pin.

11. The lighting device of claim 10, wherein the second connectors each further comprises:
a second via hole in the second substrate; and
a second solder filled in the second via hole to couple the second substrate and the second pin.

12. The lighting device of claim 1, wherein each of the second substrates includes a second connection terminal, and
wherein the second connector electrically connects the second connection terminal of the second substrate to the first connection terminal of the first substrate.

13. The lighting device of claim 1, wherein each of the second substrates has a plurality of side surfaces, and
wherein the extension unit contacts a first side surface of the second substrate, and adjacent connection units contact second and third side surfaces of the second substrate.

14. The lighting device of claim 1, wherein adjacent connection units extending in opposite directions have a total length substantially identical to a length of the connector unit.

15. The lighting device of claim 1, wherein the extension unit has a first end connected to the connector unit and a second end spaced from the second end, and
wherein the connection units are connected to the extension unit between the first end and second end.

16. The lighting device of claim 1, wherein a plurality of connection units extend from a first side of the extension unit and a plurality of connection units extend from a second side of the extension unit.

17. The lighting device of claim 1, wherein the extension unit is attached to a first side of the connector unit, and
wherein the plurality of first connectors are on a second side of the connector unit, the second side being opposite the first side.

18. The lighting device of claim 17, wherein one of the plurality of first connection terminals is on the first side of each of the connection units.

19. The lighting device of claim 1, wherein the connection units each have a first side facing the connector unit and a second side opposite the first side, and
wherein the first connection terminals are in the second side of each connection unit.

20. The lighting device of claim 1, wherein the connection units each have a first end connected to the extension unit and a second free end.

* * * * *